United States Patent [19]

Durst

[11] Patent Number: 5,202,559
[45] Date of Patent: Apr. 13, 1993

[54] BALL-AND-SOCKET SWITCH FOR DETECTING AND SIGNALLING SELECTABLE INCLINATION DIRECTIONS OF A BASE PLANE

[75] Inventor: Klaus Durst, Bruchsal, Fed. Rep. of Germany

[73] Assignee: Nokia (Deutschland) GmbH, Fed. Rep. of Germany

[21] Appl. No.: 884,769

[22] Filed: May 18, 1992

[30] Foreign Application Priority Data

May 21, 1991 [DE] Fed. Rep. of Germany .... 9106217[U]

[51] Int. Cl.$^5$ .............................................. G01D 5/34
[52] U.S. Cl. ........................... 250/231.1; 200/61.45 R; 73/517 R
[58] Field of Search .................... 250/229, 221, 231.1; 340/709, 710, 440, 443; 341/31; 73/517 R, 518, 517 B; 200/61.45 R, 61.52, DIG. 29

[56] References Cited

U.S. PATENT DOCUMENTS

| | | | |
|---|---|---|---|
| 4,450,353 | 5/1984 | Sjolund | 250/231.1 |
| 4,479,111 | 10/1984 | Madsen et al. | 341/31 |
| 5,030,955 | 7/1991 | Durst et al. | 341/176 |
| 5,136,127 | 8/1992 | Blair | 200/61.45 R |

FOREIGN PATENT DOCUMENTS

| | | |
|---|---|---|
| 0287107 | 10/1988 | European Pat. Off. |
| 8908132 | 10/1989 | Fed. Rep. of Germany . |
| 3924551 | 1/1991 | Fed. Rep. of Germany . |
| 1504706 | 12/1967 | France . |

OTHER PUBLICATIONS

Funkschau, No. 17, Aug. 9, 1991, pp. 62–63.

Primary Examiner—David C. Nelms
Assistant Examiner—Que T. Le
Attorney, Agent, or Firm—Ware, Fressola, Van Der Sluys & Adolphson

[57] ABSTRACT

For the purpose of forming a base bearing position (4), the inside of the bottom portion (10) of the ball-guiding socket housing (1) of a ball-and-socket switch, where this bottom portion defines a base plane, is provided with a pyramid-shaped recess (8) as the base bearing position of the switching ball (3) in a (horizontal) normal (or rest) position of the ball-and-socket switch. The base bearing position is formed by a circular recess in the area of the vertex (9) of the pyramid and defines a particular tilting angle (a) of the switching ball. The light transmission elements (16) and the light reception elements are arranged in light-tight chambers behind the side walls (14) of the internal space (6) of the socket housing, these chambers, for the purposes of light transmission, being connected to the internal space by means of apertures (20) in the side walls (14) terminating in rotation-symmetric recesses that narrow in the direction of the chambers. The recesses are shaped in such a way that, whenever a given inclination position is reached, they will come to form together with the switching ball then bearing against the inner face (28) of the recess, a closed and light-tight channel.

9 Claims, 2 Drawing Sheets

BALL-AND-SOCKET SWITCH FOR DETECTING AND SIGNALLING SELECTABLE INCLINATION DIRECTIONS OF A BASE PLANE

BACKGROUND OF THE INVENTION

1. Field of the Invention

The present invention relates to a ball-and-socket switch for signalling the selectable inclination directions of a base plane.

2. Description of the Prior Art

Such gravity-dependent switches refer to the force of gravity and characterize the deviation of a base plane from a particular position of this plane with respect to the force of gravity in a certain direction. The particular position of the base plane with respect to the force of gravity is the rest position of the base plane. Ball-and-socket switches of this kind are used to signal the deviation of an object from a given rest or operating position, and they can also be used to produce switching or control commands that depend on a position or a setting. For example, it is known from the German utility model specification DE-898132.3 for such a switch to be incorporated in portable appliances or equipment, especially fan heaters, irons and the like, with a view to monitoring the operating position of the equipment and then cutting off the current supply whenever the appliance assumes a position other than its operating position.

From the French patent application No. 1.504.706, again, there is known a mechanical ball-and-socket switch with several bearing positions of a switching ball that, by means of its weight, will close mechanical switches at each such bearing position. This makes it possible to switch different functions according to the particular position of the ball-and-socket switch. Furthermore, the switching ball is maintained in its switch position in a relatively long tube running in the direction of the force of gravity. When particular control commands have to be set with the ball-and-socket switch of the French patent specification, one has to select particular positions of the ball-and-socket switch that are determined by the external shape of the socket that guides the ball of the ball-and-socket switch.

A ball-and-socket switch has been proposed by the present applicants in DE-Offenlegungsschrift 3924551 and makes it possible to set certain selectable positions of the ball-and-socket switch. Given the particular design of the ball-guiding socket housing of the ball-and-socket switch, the switching ball within the housing can assume only a very limited number of rest or final bearing positions. Intermediate positions are not possible in this socket. This is obtained by means of special guidance elements in the socket housing of this switch and, more precisely, a pyramid-shaped recess in the base plane of the socket housing and a special design of the side walls that rise out of this base plane in the interior of the socket housing. These side walls are so designed that they will not permit the switching ball to come to rest between any two of its final bearing positions and will always deflect it into one of these final bearing positions.

SUMMARY OF THE INVENTION

The present invention provides a socket housing for the switching ball that enables, even when relatively small switching balls are used (with a diameter of less than 3 mm, for example), the highly light-tight switching ball, when it is in its final bearing positions, to have a good seal of the light entry or exit opening even at relatively small inclination angles.

Use of the known ball-and-socket switches has shown that infrared light, in particular, tends to propagate intensively and uniformly in such socket housings. This occurs even in narrow and intricate areas, so that light openings that are less effectively sealed will still allow a relatively large amount of infrared light to pass and will thus set substantial limits to the switching behavior of such photoelectric ball-and-socket switches. This deteriorated switching performance can fall to a level where the switching differences fall within the scatter range of the industrially produced light elements. The inclusion of the light elements in separate chambers, the manner in which light passes into and out of the chambers according to the present invention and the way in which the invention permits the switching ball to rest in its final bearing position make it possible for the light passages into or out of the chambers of the light elements to be sealed so tightly that only an insignificant amount of light will penetrate at the position, and this even when the switching ball exerts only a very small bearing pressure. Despite the relatively good light seal provided by such a socket housing, it can be produced (and also assembled) simply and economically as a two-part pressed component. It is particularly advantageous to equip both the bottom and the cover of the ball-guiding socket housing with a base plane and to arrange a pyramid-shaped, recess in each of these base planes. When this is done, the ball-and-socket switch can be used in two positions, for example, in a suspended position or a bearing (supported) position.

BRIEF DESCRIPTION OF THE DRAWINGS

The invention will now be discussed in greater detail by reference to advantageous embodiments. The figures of the appended drawings are as follows.

DETAILED DESCRIPTION OF THE PREFERRED EMBODIMENT

Figure 1:
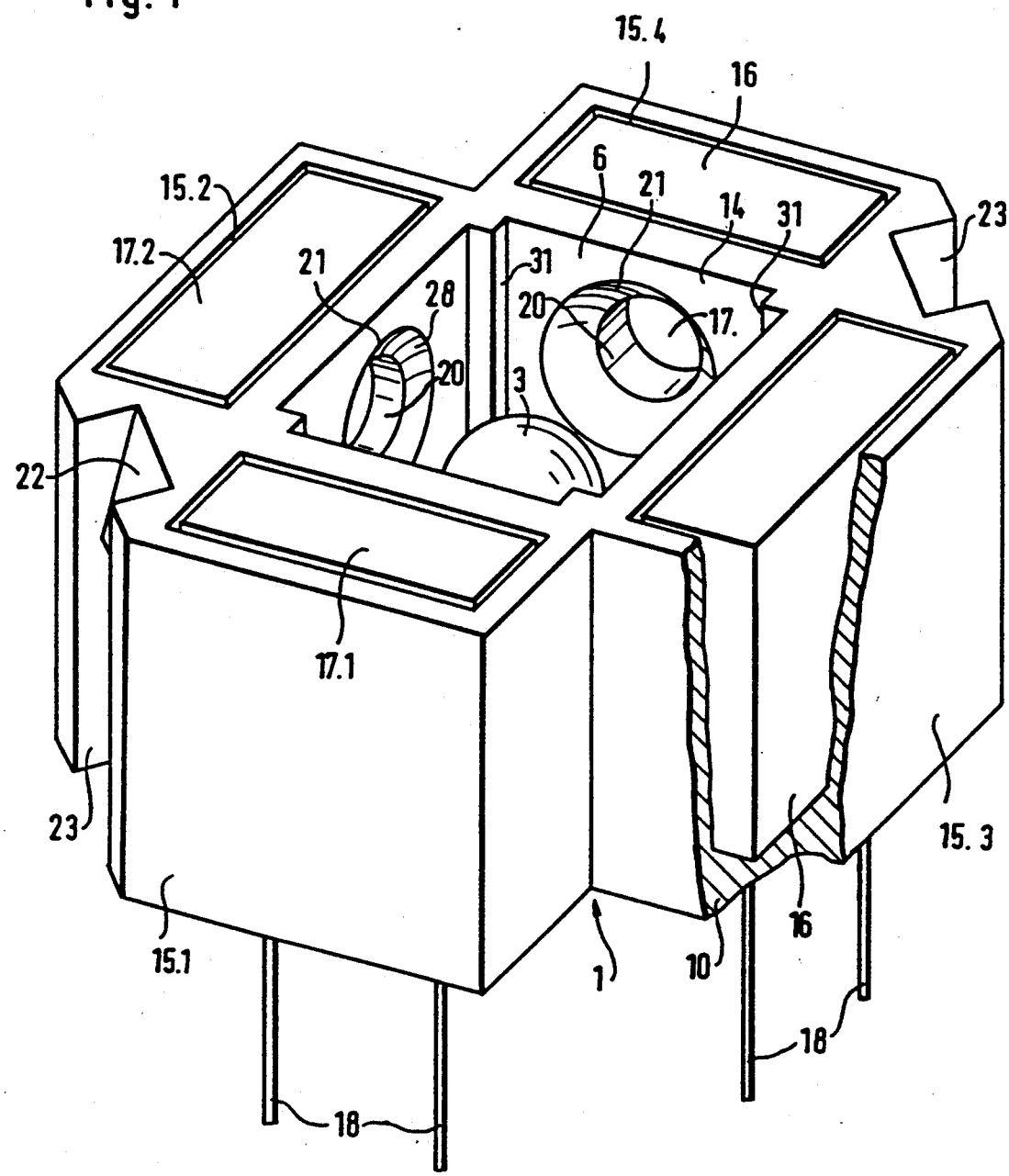
FIG. 1 is a simplified perspective view of an assembled socket housing of a ball-and-socket switch of the present invention with its cover removed.
Figure 2:
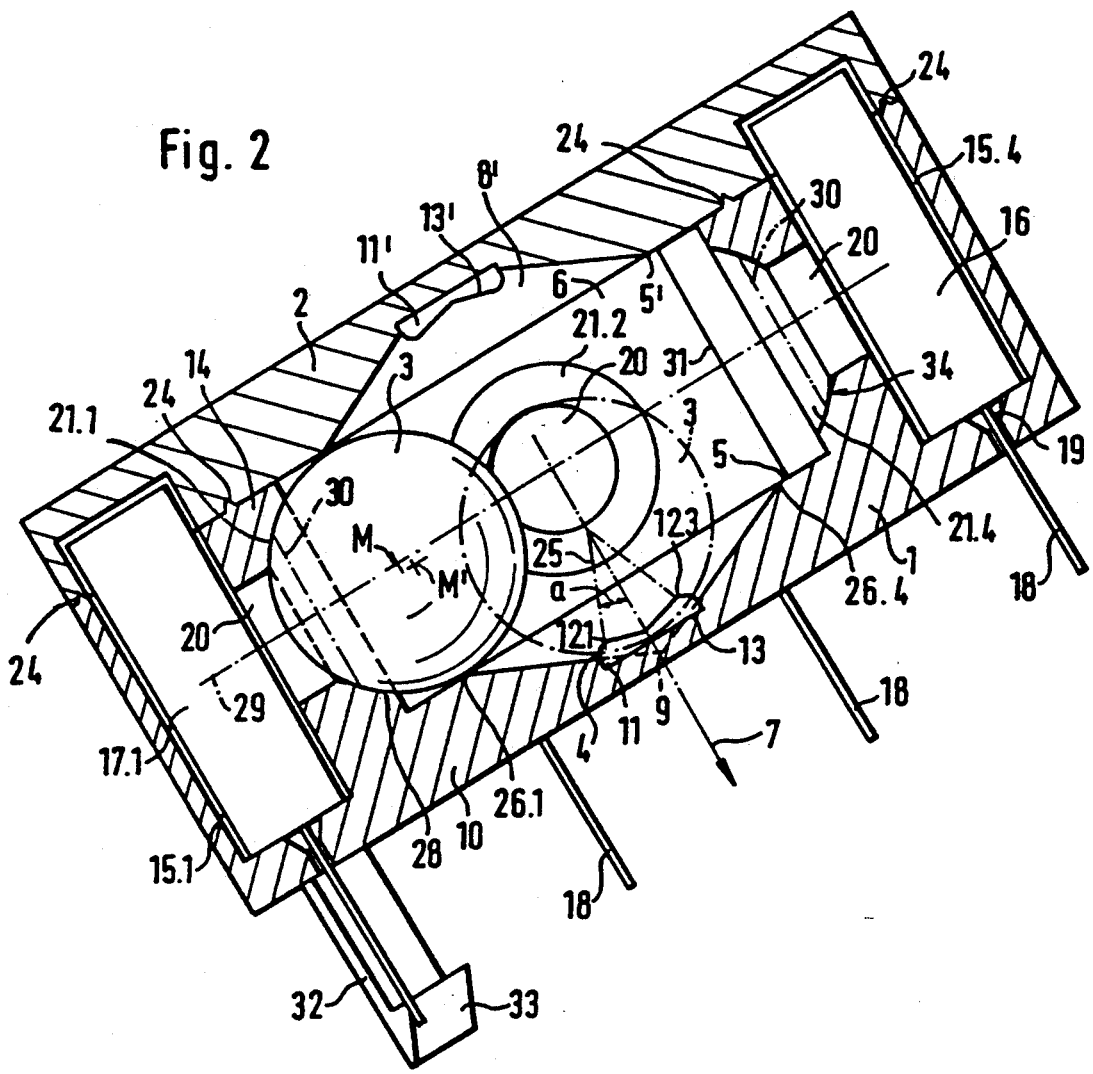
FIG. 2 is a longitudinal cross-sectional view through the ball-and-socket switch of the present invention in a left inclined position and showing the switching ball in both its normal (or rest) position (in phantom line) and one of its bearing positions (in solid line)
Figure 3:
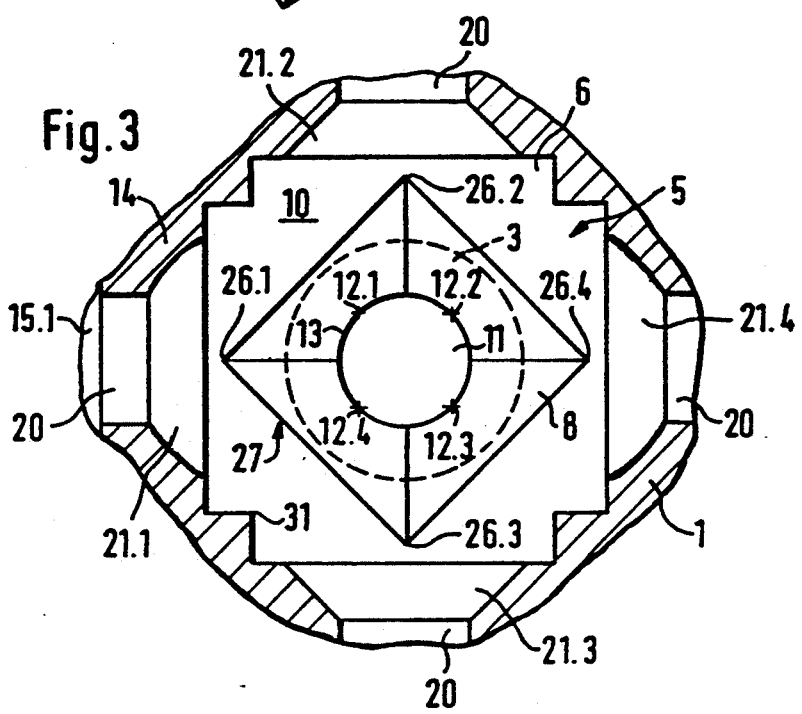
FIG. 3 is a cross-sectional view of a portion of the socket housing shown in FIGS. 2 showing the base plane, together with the pyramid-shaped recess contained therein.

FIG. 1 shows a simplified perspective view of a ball-and-socket switch, where the cover 2 (FIG. 2) has been removed from the socket housing 1 and is not shown in this figure. FIG. 2, on the other hand, shows a section along a vertical plane through the axis of symmetry 29 of the ball-and-socket switch illustrated by FIG. 1, in this case with the cover 2 in position on the socket housing 1. The ball-and-socket switch contains a ball (or sphere) as the switching element, which will here be designated as the switching ball 3, which is at its normal (or rest) position (in phantom line in FIG. 2) in a bearing position 4 on the socket housing 1. The socket housing 1 is provided with a base plane 5 that is defined in the bottom portion 10 of the socket housing 1 and which, in the normal (or rest) position of the ball-and-socket switch, is arranged at right angles to the force of gravity 7. The bottom portion 10 of the socket housing 1 is provided with a pyramid-shaped recess 8 such that the vertex 9 of the pyramid, once again in the normal position of the ball-and-socket switch, points in the direction of the force of gravity. In the general area of the pyramid vertex 9, the bottom portion 10 of the socket housing 1 is provided with a further recess 11, which is of circular shape, so that the rim of this recess, together with the side faces of the pyramid, constitutes the bearing position 4 on the socket housing 1. In the portion of the socket housing 1 that is shown in FIG. 3, the base plane 5 must be considered as the delimitation of the bottom portion 10 of the socket housing 1 with respect to the internal space 6, where the bottom portion lo includes the pyramid-shaped recess 8 and the subsequent circular recess 11. The points 12.1 to 12.4 at which the switching ball 3 bears against an inner edge 13 of the pyramid-shaped recess 8 have also been shown in this figure. These four points 12.1 to 12.4 constitute the base bearing position 4 for the switching ball 3 at the center of the socket housing 1.

In the embodiment here considered, the internal space of the socket housing 1 is delimited by four sides walls 14 that rise perpendicularly out of the base plane 5, each of the walls 14 bearing on its outside a chamber (15.1 to 15.4) intended to accommodate either a light transmission element 16 or a light reception element (17.1, 17.2). The connecting wires 18 of the light transmission and reception elements 16 and 17.1 to 17.2 are passed through apertures 19 in the bottom portion 10 of the socket housing 1. For the purpose of leading from the chambers (15.1 to 15.4) to the internal space 6, each of the side walls 14 of the chambers 15.1 to 15.4 is provided with an aperture 20 that passes through the side wall 14 between its associated chamber and the internal space 6 of the socket housing 1 and terminates at a bottom end of a rotation-symmetric recess 21.1 to 21.4 on the inside of the side wall 14. Each of the recesses 21.1 to 21.4 narrow as it extends from the internal space 6 to its associated aperture 20. As particularly advantageous shapes of these rotation-symmetric recesses 21.1 to 21.4, the recesses 21.2, 21.3 are a funnel-shaped, whereas the recesses 21.1, 21.4 are in the form of a truncated spherical dome.

In the embodiment under consideration, the cover 2 is fixed to the socket housing 1 and maintained in position there by means of resilient snap-on catches (not shown). FIG. 1 provides a schematic illustration of the projections 22 situated between the guide walls 23 of the socket housing 1 that serve as anchorage points for the resilient snap-on catches on the cover 2. FIG. 2, in turn, illustrates the simple interlock devices 24 between the cover 2 and the socket housing 1 that serve to make the connection between the cover 2 and the socket housing 1 light-tight.

As seen in FIG. 2, the tilting angle a of the switching ball 3 with respect to the base bearing position 4 is the angle formed between the projection of the ball radius to one of the bearing points 12.1 to 12.4 and the force of gravity 7 in the normal (rest) position of the ball-and-socket switch. When the inclination of the ball-and-socket switch exceeds this tilting angle a, the switching ball 3 will first tilt from the base bearing position 4 in the direction that is inclined furthest downward and will then roll on two adjacent faces of the pyramid-shaped recess 8 into the deepest-lying corner 26.1 of the line polygon 27 formed by the intersection of the pyramid-shaped recess 8 and the base plane 5. The angle between the side faces of the pyramid-shaped recess 8 and the base plane 5 is so chosen that, whenever the switching ball 3 tilts out of its base bearing position, it will already find itself on a rolling track that is inclined slightly downwards. Once the switching ball 3 reaches the edge of the base plane 5 in the line polygon 27, it will continue rolling along the line polygon 27 towards the corner 26.1 lying in the direction of its motion, though now at a steeper downward slope, and will continue this motion until, before it actually reaches the corner 26.1, it makes contact with the inner face 28 of the rotation-symmetric recess 21.1 of the socket housing 1. The rotation-symmetric recess 21.1 in the side wall 14 is so dimensioned that, just before the switching ball 3 actually makes contact with the inner face 28 of the recess, its center in position M' will pass through the axis of symmetry 29 of the recess 21.1 into position M. When its center is in position M, the switching ball 3 will bear with a circular contour on its own spherical surface against a circle 30 of the inner face 28 of the recess 21.1 that does not coincide with the outer edge of the recess 21.1. This ensures that the light flow through the recess will be sealed not only in the manner of a wedge, but rather along an extensive channel all around the bearing position. One thus obtains a far more favorable light seal than would be obtained with a wedge-type seal. The inner diameter of the spherical dome is only slightly greater than the diameter of the switching ball 3, so that there not only comes into being a relatively long light-sealing channel, but the arrangement also avoids the switching ball 3 becoming stuck in such a final bearing position. The bearing positions of the switching ball 3 in the individual recesses 21.1 and 21.4 of the side walls 14 are here designated as the final bearing positions 30, because these bearing positions 30 lie at the end of the possible rolling tracks of the switching ball 3.

A slightly shorter light-sealing channel is obtained when the rotation-symmetric recess in the side wall 14 is given the funnel shape as illustrated by the alternative embodiment of the rotation-symmetric recesses 21.2 and 21.3 of FIG. 3. A vertex of each of the conical recesses 21.2, 21.3 terminates in its associated chamber 15.2, 15.3.

The rejection edges 31 are formed inside the internal space 6 of the socket housing 1 between any two adjacent rotation-symmetric recesses 21.1 to 21.4 thereby preventing the switching ball 3 from assuming a stable position anywhere other than in a bearing position.

FIG. 2 also shows, albeit schematically, a resilient arm 32 fixed to the cover 2 of the socket housing 1, the free end of this arm being provided with a snap-on catch 33 for fixing the ball-and-socket switch to a printed circuit board (not shown) in a manner readily apparent to the skilled artisan so that it need not be further considered here.

As seen in FIG. 2, the inside of the cover 2 forms a base plane 5' and the cover is provided with a second pyramid-shaped recess 8' and a contiguous circular recess 11' with an inner edge 13' that are in every respect similar to the pyramid-shaped recess 8 and its contiguous circular recess 11 with its inner edge 13 in the bottom portion 10 of the socket housing 1. This has the advantage that the ball-and-socket switch shown in FIG. 2 can be used both in a supported position or in a suspended position without any additional measures.

All the light transmission elements 16 and light reception elements 17.1, 17.2 needed for the ball-and-socket switch are arranged in the chambers 15.1 to 15.4 situated on the side walls 14 of the socket housing 1. This ensures that all the light transmission elements 16 and reception elements 17.1 and 17.2 are subject to the same favorable light-sealing measures.

Thus, it can be seen from the foregoing specification and attached drawings that the present invention provides an effective means for establishing intimate contact of the switching ball in the rotation-symmetric recesses.

The preferred embodiment admirably achieves the objects of the present invention; however, it should be appreciated that departures can be made by those skilled in the art without departing from the spirit and scope of the invention which is limited only by the following claims.

What is claimed is:

1. A ball-and-socket switch for signalling selectable inclination directions of a base plane, comprising:
   a ball-guiding socket housing containing a base plane and having a pyramid-shaped recess, the pyramid-shaped recess contains a base bearing position for a switching ball that determines a tilting angle thereof, the base plane and the pyramid-shaped recess form a line polygon having corners adjacent final bearing positions of the switching ball that define chosen directions of inclination and constitute switching positions of the ball-and-socket switch, each of the final bearing positions is a circular bearing position having gradually narrowing, rotation-symmetric recess in a side wall of the socket housing that rises from the base plane;
   a switching ball mounted for movement within said ball-guiding socket housing between the base bearing position and the final bearing positions, the switching ball being dimensionally sized where each of the rotation-symmetric recesses accommodate less than half of the switching ball and a center point of the switching ball will pass an axis of symmetry of the associated rotation-symmetric recess when the switching ball is about to come into contact with the associated corner of the line polygon; and
   light transmission and light reception elements arranged at the final bearing positions of the switching ball as to be covered in a light-tight manner when the switching ball comes to bear against the appropriate final bearing position.

2. A ball-and-socket switch in accordance with claim 1, wherein the rotation-symmetric recesses spherical dome shaped and have a diameter only slightly greater than the diameter of the switching ball.

3. A ball-and-socket switch in accordance with claim 2, further including a cover for the socket housing containing a base plane with a pyramid-shaped recess.

4. A ball-and-socket switch in accordance with claim 3, wherein each of the rotation-symmetric recesses communicates via an aperture with a chamber that is associated solely with that particular recess, the light transmission and light reception elements are arranged in the chambers associated with the recesses at the final bearing positions.

5. A ball-and-socket switch in accordance with claim 1, wherein the rotation-symmetric recesses are conical in shape.

6. A ball-and-socket switch in accordance with claim 5, further including a cover for the socket housing containing a base plane with a pyramid-shaped recess.

7. A ball-and-socket switch in accordance with claim 6, wherein each of the rotation-symmetric recesses communicates via an aperture with a chamber that is associated solely with that particular rotation-symmetric recess, the light transmission and light reception elements are arranged in the chambers associated with the recesses at the final bearing positions.

8. A ball-and-socket switch in accordance with claim 1, further including a cover for the socket housing containing a base plane with a pyramid-shaped recess.

9. A ball-and-socket switch in accordance with claim 1, wherein each of the rotation-symmetric recesses communicates via an aperture with a chamber that is associated solely with that particular rotation-symmetric recess, the light transmission and light reception elements are arranged in the chambers associated with the recesses at the final bearing positions.

* * * * *